United States Patent
Itoh

(10) Patent No.: US 9,603,266 B2
(45) Date of Patent: Mar. 21, 2017

(54) DISPLAY DEVICE

(71) Applicant: Sharp Kabushiki Kaisha, Osaka (JP)

(72) Inventor: Kohji Itoh, Osaka (JP)

(73) Assignee: SHARP KABUSHIKI KAISHA, Osaka (JP)

(\*) Notice: Subject to any disclaimer, the term of this patent is extended or adjusted under 35 U.S.C. 154(b) by 83 days.

(21) Appl. No.: 14/439,779

(22) PCT Filed: Oct. 17, 2013

(86) PCT No.: PCT/JP2013/078128
§ 371 (c)(1),
(2) Date: Apr. 30, 2015

(87) PCT Pub. No.: WO2014/073348
PCT Pub. Date: May 15, 2014

(65) Prior Publication Data
US 2015/0296634 A1   Oct. 15, 2015

(30) Foreign Application Priority Data

Nov. 8, 2012 (JP) ................................. 2012-246272

(51) Int. Cl.
*H05K 5/00* (2006.01)
*G02F 1/1333* (2006.01)

(52) U.S. Cl.
CPC ..... *H05K 5/0017* (2013.01); *G02F 1/133308* (2013.01); *H05K 5/0004* (2013.01); *G02F 2001/13332* (2013.01); *G02F 2001/133328* (2013.01); *G02F 2201/465* (2013.01)

(58) Field of Classification Search
CPC ........................ H05K 5/0017; G02F 1/133308
See application file for complete search history.

(56) References Cited

U.S. PATENT DOCUMENTS

| 2006/0077544 | A1* | 4/2006 | Stark | G02F 1/13336 359/448 |
| 2011/0025594 | A1* | 2/2011 | Watanabe | G02F 1/13336 345/102 |
| 2012/0008340 | A1* | 1/2012 | Tomotoshi | G02F 1/13336 362/616 |
| 2012/0026658 | A1 | 2/2012 | Yoshimatsu et al. | |
| 2012/0069273 | A1* | 3/2012 | Watanabe | G02B 5/0215 349/64 |

(Continued)

FOREIGN PATENT DOCUMENTS

| JP | 2003-302909 | * 10/2003 | ............... G09F 9/00 |
| JP | 2011-133829 | * 7/2011 | ............... G09F 9/00 |

(Continued)

*Primary Examiner* — Sang V Nguyen
(74) *Attorney, Agent, or Firm* — Chen Yoshimura LLP

(57) ABSTRACT

Provided is a display device that has: first engaging portions formed on a frame member; and second engaging portions that are formed on a front plate and engage with the first engaging portions. A gap is formed between an inner surface of a side wall of the frame member and a side wall of a cutout of the front plate. The first engaging portion and the second engaging portion engage with each other such that movement is restricted in a long side direction of the side wall, while sliding in a direction intersecting with the side wall is enabled.

13 Claims, 12 Drawing Sheets

(56) References Cited

U.S. PATENT DOCUMENTS

2012/0113614 A1* 5/2012 Watanabe ........... G02F 1/13336
361/810
2013/0335673 A1* 12/2013 Moriwaki ............. G09F 9/3026
349/63

FOREIGN PATENT DOCUMENTS

| JP | 2012-34289 A | | 2/2012 | |
|----|----|----|----|----|
| JP | WO 2012-029347 | * | 3/2012 | ............... H05K 7/12 |
| JP | 4948686 | * | 6/2012 | ........... H05K 5/0239 |

* cited by examiner

FIG. 1
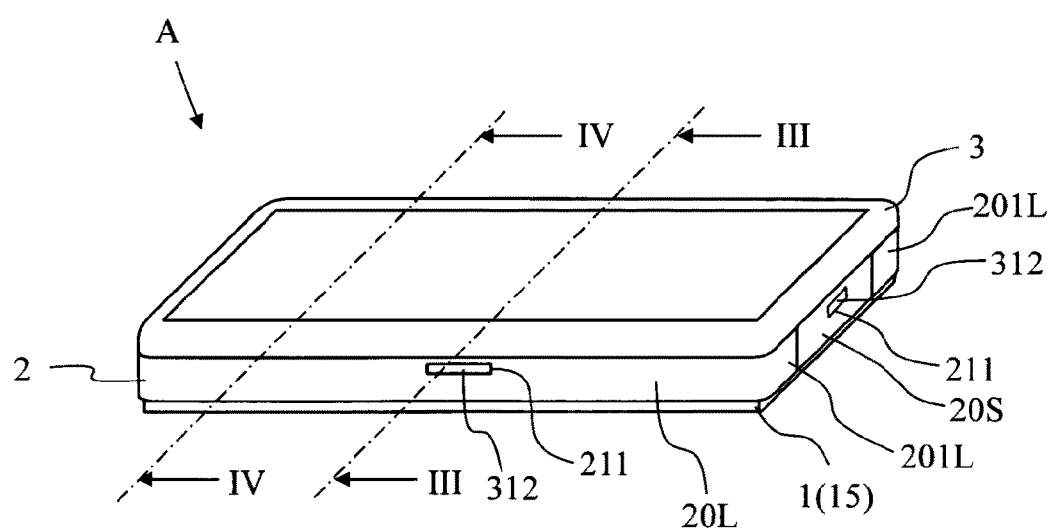
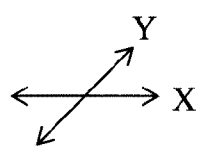

Y-direction

X-direction

DISPLAY DEVICE

TECHNICAL FIELD

The present invention relates to a display device.

BACKGROUND ART

In recent years, there have been greater expectations for display devices, such as liquid crystal display devices, to provide a larger display region for displaying images and a narrower non-display region (frame region) surrounding the display region, or, in other words, a narrower frame. In many cases, such display devices are provided with a front plate made of a transparent material such as glass or resin on the front surface of the display panel for the purpose of protecting and reinforcing the display panel.

For example, Patent Application Laid-Open Publication No. 2012-34289 discloses a display device capable of providing a narrower and thinner frame. The display device described in Patent Application Laid-Open Publication No. 2012-34289 is configured such that a mounting frame is adhered to the periphery of the back surface of the front frame (front plate) with a double-sided tape. Mounted on the mounting frame via a mounting member is a back chassis, on which a light guide plate, a light source, optical sheets (the preceding three items constituting a backlight), and a panel unit (a display panel) are disposed.

According to this configuration, the mounting member, which is locked to the mounting frame, is fixed on the back surface of the back chassis, and the fixed portion is not viewable from the front side. This allows the frame region used for mounting members to be smaller than in a display device with a conventional configuration, in which the front frame is mounted via bosses formed in the frame region. In addition, the configuration also allows the frame to be thinner since bosses do not need to be formed.

RELATED ART DOCUMENT

Patent Document

Patent Document 1: Japanese Patent Application Laid-Open Publication No. 2012-34289

SUMMARY OF THE INVENTION

Problems to be Solved by the Invention

In the method described in Japanese Patent Application Laid-Open Publication No. 2012-34289, the front frame (front plate) is adhered to the mounting frame with a double-sided tape. In order to apply this method to a larger display device, however, the adhesion area must be increased to support the front frame (front plate) since the weight of the front frame is greater in a large display device. A narrower frame may become difficult to achieve as a result.

In addition, the aforementioned display device has heat sources such as a light source, electrical components, and the like, and heat generated by such heat sources increases the temperatures of the front plate and the mounting frame. In many cases, the front plate of the display device is made of a transparent glass or resin, and the mounting frame is made of a metal. For this reason, the coefficients of linear expansion of the front plate and the mounting frame are markedly different. When components with different coefficients of linear expansion are placed in close proximity to each other, a difference in deformation (difference in thermal expansion) arises as a result of a rise in temperature.

In addition, in Japanese Patent Application Laid-Open Publication No. 2012-34289, the front frame (front plate) and the mounting frame are adhered to each other by a double-sided tape, and the movements of the front frame and the mounting frame relative to each other are restricted at the adhered portion. For this reason, thermal stress is generated by the thermal expansion of each component. In a larger display device, a larger adhesion area increases the difference in thermal expansion, or, in other words, thermal stress. A larger thermal stress then raises the risk of warping, bending, and other deformations of the front frame (front plate) and (or) the front mounting frame.

Further, the aforementioned method requires the step of adhering the front frame (front plate) to the mounting frame by using the double-sided tape or the like, as well as the step of engaging the mounting member with the mounting frame and the back chassis, thereby increasing the steps of manufacturing the display device.

The present invention aims to provide a display device capable of minimizing the steps of manufacturing the display device and preventing the front plate from deforming while achieving a narrower frame.

Means for Solving the Problems

To achieve the objective described above, the present invention provides a display device, including: a frame member having a side wall enclosing a display unit; a front plate disposed on a front surface of the display unit and the frame member, the front plate having a stepped peripheral edge of a back surface thereof to receive a top of the side wall of the frame member; a first engaging portion formed on the frame member; and a second engaging portion formed on the front plate that engages the first engaging portion, wherein a gap is provided between an inner surface of the side wall of the frame member and a side wall of the stepped peripheral edge of the back surface of the front plate, and wherein the first engaging portion engages the second engaging portion such that movement of the first engaging portion and the second engaging portion is restricted in a direction along the side wall of the frame member and so as to be slidable in a direction perpendicular to the side wall.

According to the configuration described above, the engagement of the first engaging portions with the second engaging portions makes it possible to set the positions of the frame member and the front plate while preventing dislodgment. In addition, in each of the sides of the frame member and the front plate, the difference in deformation caused by thermal expansion increases in a direction intersecting with (orthogonal to) the direction along the corresponding side. Since a gap is formed between the inner surface of the frame member and the side wall of the cutout (stepped peripheral edge of the back surface) in a direction along which the difference in deformation caused by thermal expansion increases, it is possible to prevent thermal stress from occurring even if a difference in deformation due to thermal expansion arises between the frame member and the front plate.

Since the first engaging portion and the second engaging portion are slidable in a direction intersecting with the side wall of the frame member (direction in which the difference in deformation due to linear expansion increases), it is possible to absorb the difference in deformation due to thermal expansion in each side of the frame member and the front plate, thereby suppressing thermal stress between the first engaging portion and the second engaging portion.

In addition, since the positions of the frame member and the front plate are set by the engagement of the first engaging portion with the second engaging portion, a step of adhering the frame member to the front plate becomes unnecessary, and it is therefore possible to reduce the number of steps required for manufacturing.

In the above configuration, the frame member and the front plate may have a rectangular shape in a front view, and the first engaging portion and the second engaging portion may be respectively formed in two short sides and at least one long side of the frame member and the front plate.

In the above configuration, the first engaging portion and the second engaging portion may be formed at a central portion of the respective sides of the frame member and the front plate.

In the above configuration, the first engaging portion may be a through hole formed in the side wall of the frame member, and the second engaging portion may be a protrusion provided on the side wall of the stepped peripheral edge of the back surface of the front plate so as to protrude therefrom.

In the above configuration, the first engaging portion may be an engaging member protruding toward an inner side of the frame member, and the second engaging portion can be a recessed cutout formed in a side face of the stepped peripheral edge of the back surface of the front plate, the recessed cutout being formed such that a protrusion of the engaging member is inserted therein.

In the above configuration, the frame member may further include a retaining portion protruding laterally and inwardly from a front end of the frame member, the stepped peripheral edge of the back surface of the front plate may further include a groove receding laterally to receive the retaining portion of the frame member, and a gap may be provided between a bottom of the groove and a tip of the retaining portion.

In the above configuration, a front surface side of the front plate opposing the cutout stepped peripheral edge of the back surface may be provided with a curved surface that does not cause light passing through a periphery of the front plate to refract toward the front surface side.

In the above configuration, the bottom of the groove may be inclined so as not to block light emitted from the display unit and passing through the curved surface.

In the above configuration, the stepped peripheral edge of the back surface may have an inclined face such that light emitted from the display unit and entering the curved surface of the front plate is not blocked by the inclined face, and a front end of the frame member may be provided with a tapering portion formed along the inclined face of the stepped peripheral edge of the back surface.

Effects of the Invention

According to the present invention, it is possible to provide a display device capable of minimizing the steps of manufacturing the display device and suppressing the deformation of the front plate while achieving a narrower frame.

BRIEF DESCRIPTION OF THE DRAWINGS

FIG. 1 is a perspective view of an example of a display device according to the present invention.

DETAILED DESCRIPTION OF EMBODIMENTS

Embodiment 1

Figure 2:
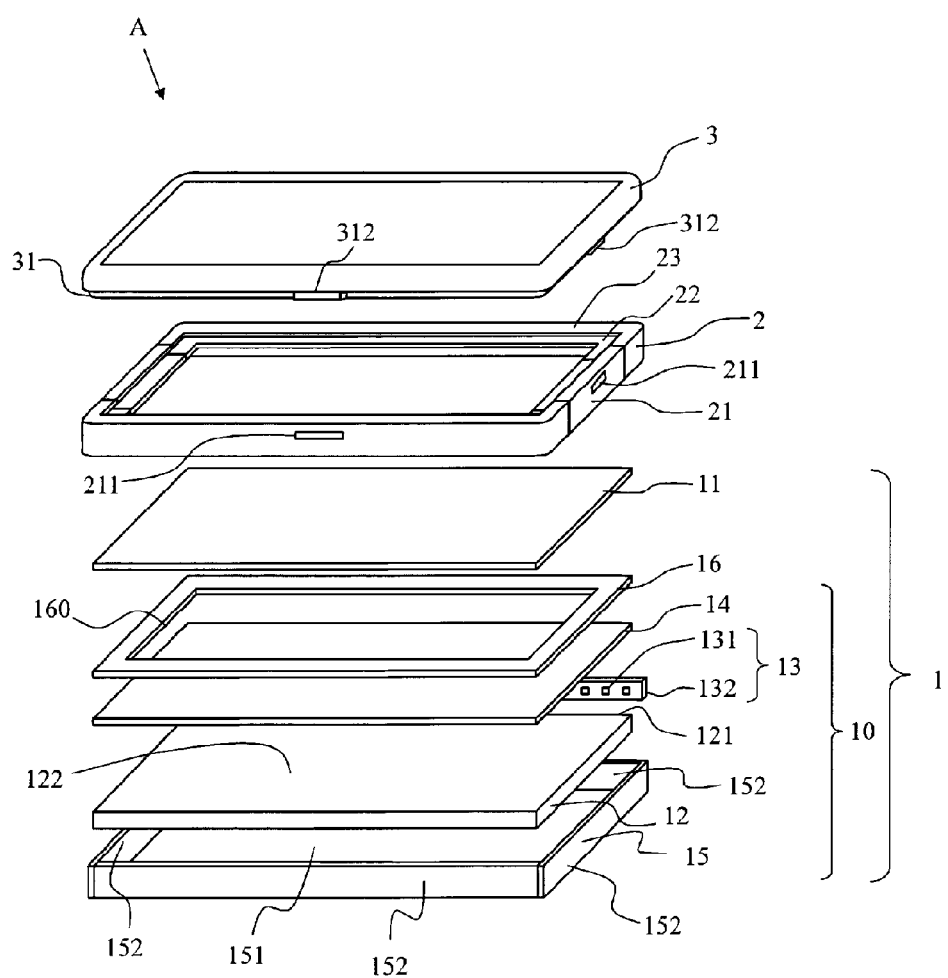
FIG. 2 is an exploded perspective view of the display device shown in FIG. 1.
Figure 3:
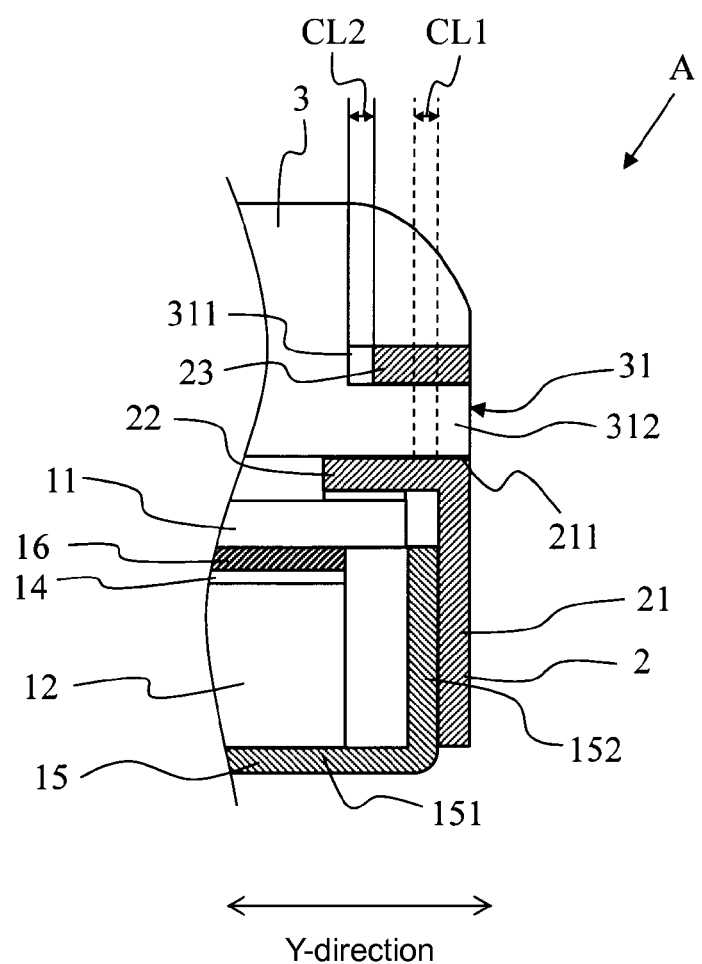
FIG. 3 is a cross-sectional view of the display device shown in FIG. 1 taken along the line III-III.
Figure 4:
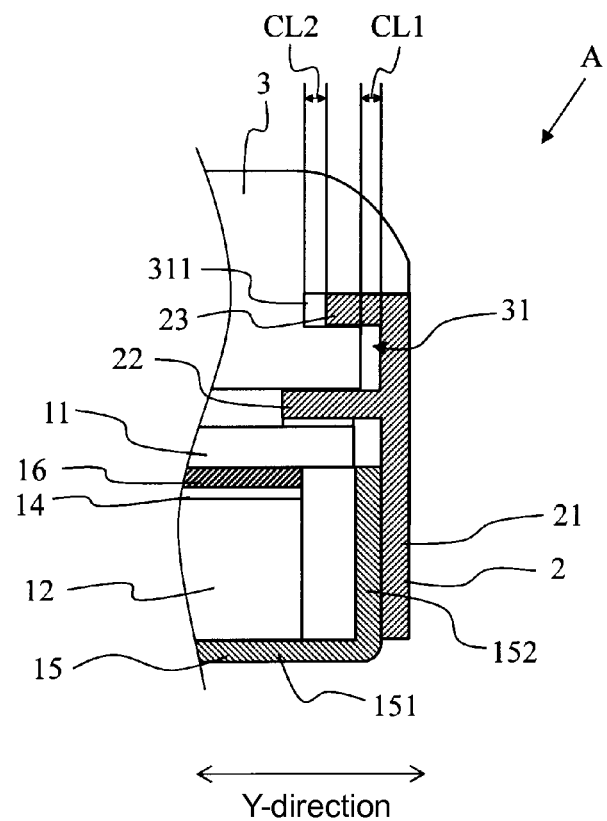
FIG. 4 is a cross-sectional view of the display device shown in FIG. 1 taken along the line IV-IV.

Embodiments of the present invention will be described with reference to diagrams. FIG. 1 is a perspective view of an example of a display device according to the present invention. FIG. 2 is an exploded perspective view of the display device shown in FIG. 1. FIG. 3 is a cross-sectional view of the display device shown in FIG. 1 taken along the line III-III, and FIG. 4 is a cross-sectional view of the display device shown in FIG. 1 taken along the line IV-IV. Since the display device according to the present invention is shaped and configured to be horizontally and vertically symmetrical, only one end of the cross section is shown in FIGS. 3 and 4.

Note that, in the following description, the direction along the long sides of a display device A will be referred to as the x-direction, and the direction along the short sides of the display device A will be referred to as the y-direction, as shown in FIG. 1. Additionally, with respect to the display device A shown in FIGS. 1 to 4, the top side of the page will be assumed to be the front surface, or the viewing side, while the bottom side will be assumed to be the back surface. In diagrams showing cross-sectional views, diagonal lines are omitted from transparent members. Further, the descriptions and diagrams below will follow the rules mentioned above.

As shown in FIGS. 1 and 2, the display device A is equipped with: a display unit 1 (display member) that displays images; a bezel 2 (frame member) that is fixed so as to surround the periphery of the front surface of the display unit 1; and a front plate 3 further disposed on the front surface of the bezel 2. Note that the display device A of the present embodiment will be described as a liquid crystal display device employing a liquid crystal display panel for the display unit 1.

The display unit 1 has a rectangular shape in a front view, and is equipped with a display surface for displaying images on the front surface. Formed in a central portion of the display surface is a display region, where images are displayed. As shown in FIG. 2, the display unit 1 is equipped with: a liquid crystal display panel 11, a light guide plate 12, a light source unit 13, optical sheets 14, a chassis 15, and a panel frame 16.

In the display unit 1, the light guide plate 12, the light source unit 13, and the optical sheets 14 are disposed inside the chassis 15 as shown in FIGS. 3 and 4, and these members constitute a backlight 10, which is used to illuminate the liquid crystal display panel 11 with light. In other words, the display unit 1 is configured to include the liquid crystal display panel 11 and the backlight 10.

A schematic configuration of the liquid crystal display panel 11 will be described. The liquid crystal display panel 11 is configured with two transparent substrates aligned with each other across a prescribed gap, and liquid crystal is sealed in the gap between the two transparent substrates. An array substrate, one of the two transparent substrates, is provided with: source wiring lines and gate wiring lines that intersect at right angles; auxiliary capacitance wiring lines arranged parallel to the gate wiring lines; switching elements (thin film transistors, for example) connected to the source wiring lines and the gate wiring lines; pixel electrodes constituting pixels; drain wiring lines for connecting drain terminals of the switching elements with the pixel electrodes; and the like. An alignment film for aligning orientations of the liquid crystal molecules and a light polarizing plate are also arranged.

An opposite substrate, which faces the array substrate across the liquid crystal layer, is provided with: a common electrode; color filters on which color portions of red, green, and blue (RGB) are respectively arranged in a prescribed sequence; and the like. Note that an alignment film is also provided on the opposite substrate in a manner similar to the array substrate. In the liquid crystal panel, voltage is applied to a portion between the pixel electrodes and the common electrode, or the liquid crystal layer adjacent to the pixel electrodes. This alters the orientations of liquid crystal materials inside the liquid crystal layer and modulates light passing through the pixels. As a result, colors of the pixels are modulated, and images are displayed on the front surface of the liquid crystal display panel 11.

The light guide plate 12 has a cuboid shape and is made of acryl, polycarbonate (PC), polystyrene (PS), or the like having a transparent property (such as transparency). The light guide plate 12 is disposed on the back surface side of the liquid crystal display panel 11, and is equipped with a light-receiving face 121 formed on a side face and a light-exiting surface 122 from which light exits as planar light with uniform surface luminance. The light guide plate 12 is arranged so that the light-exiting surface 122 faces the side of the liquid crystal display panel 11, or the front surface. As shown in FIG. 2, the light-exiting surface 122 of the light guide plate 12 has a rectangular shape in a front view. In addition, the light-receiving face 121 is formed on a side face adjacent to one of the long sides. The configuration of the light guide plate 12 is a well-known, conventional one, and the details thereof will be omitted.

Light that has entered from the light-receiving face 121 is diffused by repeated reflections inside the light guide plate 12. Since light is diffused inside the light guide plate 12, the planar light emitted by the light-exiting surface 122 has equal or substantially equal luminous flux densities, or, in other words, uniform luminance.

The light source unit 13 is equipped with a plurality of LEDs 131, which serve as a light source, and the plurality of LEDs 131 are arranged in a linear fashion on a long-shaped substrate 132. The light guide plate 12 and the light source unit 13 are disposed inside the chassis 15 so that the LEDs 131 face the light-receiving face 121. While not shown in the diagram, the light source unit 13 is fixed to (is in contact with) a side wall 152 of the chassis 15.

The optical sheets 14 include, as optical sheet members: a diffusion sheet, which diffuses the planar light emitted from the light-exiting surface 122 of the light guide plate 12; a luminance enhancement sheet (DBEF), which enhances luminance; a prism sheet that aligns the directions of light exiting the light-exiting surface 122, or, in other words, redirects light entering obliquely toward the liquid crystal display panel 11; and the like. Note that, in some cases, optical sheet members having optical properties other than those listed above are used. In addition, it is possible to omit the optical sheets 14 by configuring the light-exiting surface 122 of the light guide plate 12 to have the same properties as those of the optical sheets 14.

The chassis 15 is a bottomed box formed by bending a metal plate made of a metal such as aluminum (alloy), magnesium (alloy), steel, or stainless steel. The chassis 15 is equipped with a bottom portion 151 having a rectangular shape in a front view and the side wall 152 formed by bending the four sides of the bottom portion 151 toward the front surface side. The light guide plate 12 is disposed so as to contact the bottom portion 151, and the substrate 132 of the light source unit 13 is fixed to the side wall 152. Since the chassis 15 is made of a metal, the chassis 15 also serves as a heat dissipating member that dissipates heat generated by members inside (LEDs, semiconductor elements, and the like, for example) to the outside.

Note that, in some cases, light that enters through the light-receiving face 121 of the light guide plate 12 exits from the side opposite to the light-exiting surface 122. A reflective portion may be provided in the bottom portion 151 of the chassis 15 to redirect light exiting from the side opposite to the light-exiting surface 122 back to the light guide plate 12. As a reflective portion, a thin, flat-shaped reflective member such as a sheet-shaped, plate-shaped, or a similarly shaped reflective member may be provided, or a film that reflects light can be formed in the bottom portion 151 by applying white paint, plating, or the like. A wide range of options can be employed, provided that the reflective portion can ensure that light escaping from the light guide plate 12 is reflected back.

The optical sheets 14 are mounted on the light-exiting surface 122 of the light guide plate 12, and the panel frame 16 is disposed on the front surface side of the optical sheets 14. The panel frame 16 is formed by a resin such as polycarbonate (PC). An opening 160 is provided in a central portion of the panel frame 16, and the front surface supports the periphery of the back surface of the liquid crystal display panel 11. Additionally, the back surface of the panel frame 16 presses the front surface of the optical sheets 14. This prevents the optical sheets 14 from warping and bending. The panel frame 16 also serves as a member that prevents the light guide plate 12 (or optical sheets 14, more precisely) and the liquid crystal display panel 11 from coming into contact with each other.

In many cases, luminance of the planar light exiting from the light guide plate 12 varies greatly in the periphery of the light-exiting surface 122 (luminance is high in areas close to the light source unit 13, and low in areas farther away therefrom). On the other hand, variation in luminance is small in the central portion of the light-exiting surface 122 in many cases.

For this reason, by forming the opening 160 in the central portion of the panel frame 16 and by causing planar light entering the opening 160 to enter the liquid crystal display panel 11, it is possible to cause the planar light in the central portion that is particularly high in uniformity to enter the liquid crystal display panel 11. Note that it is preferable that the opening 160 be of the same size as, or slightly larger than, the display region of the liquid crystal display panel 11, so that light can illuminate the entire display region of the liquid crystal display panel 11.

The bezel 2 is formed by a metal such as aluminum (alloy), magnesium (alloy), steel, or stainless steel. Provided with an opening in a central portion (see FIG. 2), the bezel 2 presses the periphery of the front surface side of the display unit 1 from the front surface side and fixes the display unit 1 (the liquid crystal display panel 11, in particular). The bezel 2 is also a holding member that holds the front plate 3 disposed on the front surface side.

The bezel 2 is a frame material that has a rectangular shape in a front view. As shown in FIGS. 3 and 4, the bezel 2 is equipped with: a side wall 21 provided to surround the outer perimeter of the chassis 15; a pressing portion 22 that is orthogonal to the inner peripheral surface of the side wall 21 and provided so as to protrude inward as a whole; and a retaining portion 23 provided so as to protrude inward as a whole from the edge of the front surface side of the side wall 21.

As shown in FIGS. 3 and 4, the side wall 21 is disposed on the outside of the side wall 152 of the chassis 15. The side wall 21 and the side wall 152 of the chassis 15 are securely fixed so as not to come off from each other. Note that there is no need to employ a specific method of fixing, provided that the method can prevent the components from slipping and dislodging, and a well-known, conventional method (for example, screw tightening, friction fitting, and the like) can be used.

The pressing portion 22 is provided so as to protrude inward from the inner surface of the side wall 21 disposed in a frame-like shape, and therefore also has a frame-like shape. More specifically, the pressing portion 22 is a rectangular plate-like member having a through hole in a central portion. Note that the through hole in the central portion of the pressing portion 22 constitutes a part of the opening of the bezel 2. Additionally, the retaining portion 23 is formed parallel to the pressing portion 22, and is also a plate-like member having a through hole in a central portion in a manner similar to the pressing portion 22, albeit with a different amount of protrusion from the side wall 21.

The bezel 2 is mounted so that the side wall 21 contacts the outer side of the side wall 152 of the chassis 15. At this time, the pressing portion 22 of the bezel 2 presses the periphery of the liquid crystal display panel 11 from the front surface side. In this manner, the liquid crystal display panel 11 and the backlight 10, which are disposed inside the display unit 1, are fixed to the bezel 2 so as not to move (shift). In some cases, a protecting member is disposed between the bezel 2 and the liquid crystal display panel 11 to prevent damage to the liquid crystal display panel 11 caused by the rubbing between the bezel 2 and the liquid crystal display panel 11.

As shown in FIGS. 2 and 3, engaging holes 211 (first engaging portions) are provided in the side wall 21 of the bezel 2. The engaging holes 211 are respectively formed at central portions of the four sides of the display device A. As shown in FIG. 3, the engaging hole 211 is a through hole formed between the pressing portion 22 and the retaining portion 23. An engaging protrusion 312 (second engaging portions), which is formed on the front plate 3 and will be described later, is inserted into the engaging hole 211, and the engaging hole 211 and the engaging protrusion 312 are engaged to each other.

The front plate 3 is a transparent plate-like member formed by acryl (PMMA), polycarbonate (PC), glass, or the like. The front plate 3 is shaped and sized so as to overlap the bezel 2 in a front view. On the back surface side of the periphery of the front plate 3, a cutout 31 (stepped peripheral edge of the back surface) is formed along the periphery.

Provided at an edge of the front surface side of the cutout 31 of the front plate 3 are: a recessed groove 311, which is formed deeper than other portions along the periphery (see FIGS. 3 and 4); and the engaging protrusions 312, which are respectively formed at central portions of the sides of the front plate 3 in a front view and are more protruded from the portion in the back surface side than the recessed groove 311 (see FIG. 3).

As shown in FIGS. 3 and 4, the front surface side of the pressing portion 22 supports the back surface of the front plate 3. With the pressing portion 22 supporting the front plate 3 in this manner, the front plate 3 is prevented from coming into contact with the liquid crystal display panel 11. The retaining portion 23 is inserted into the recessed groove 311 formed inside the cutout 31. As described above, the retaining portion 23 is formed so as to protrude toward the inner side of the portion surrounded by the side wall 21. Inserting the retaining portion 23 into the recessed groove 311 formed along the perimeter of the front plate 3 suppresses the movement of the front plate 3 toward a direction away from the bezel 2 (in other words, the disengagement of the front plate 3 from the bezel 2). Additionally, since the recessed groove 311 is formed along the periphery and the retaining portion 23 protrudes toward the inner side from the edge of the front surface side of the side wall 21, the recessed groove 311 as a whole is pressed by the retaining portion 23. For this reason, when a force acts on the front plate 3 in a direction away from the bezel 2, stress is unlikely to concentrate on one part of the inner wall of the recessed groove 311, thereby preventing deformation, damage, and the like.

Figure 5:
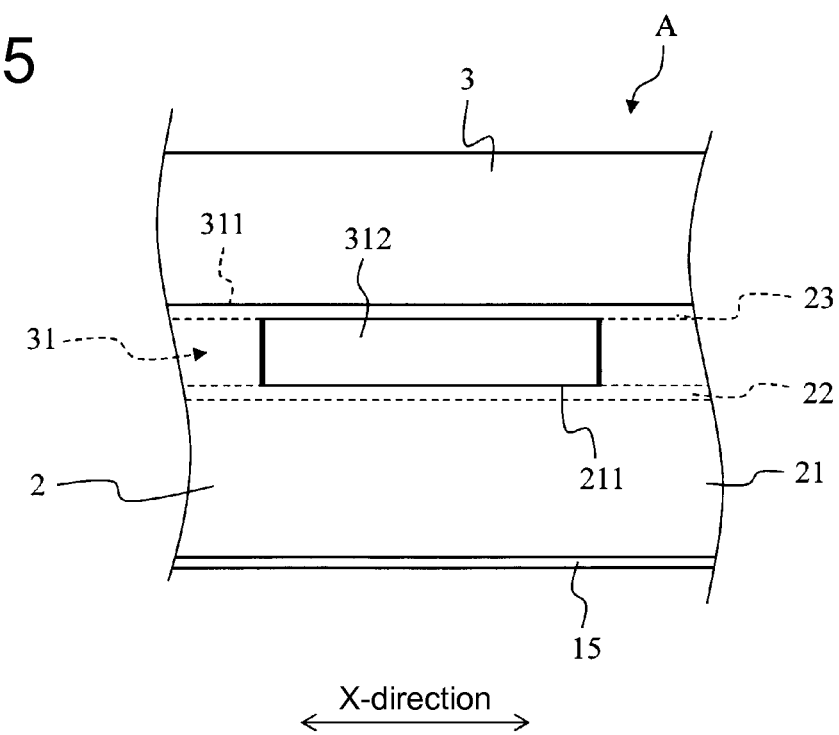
FIG. 5 is an enlarged side view of a portion where an engaging hole is engaged with an engaging protrusion.

Explained below with reference to diagrams is how the engaging holes 211 and the engaging protrusions 312 set the positions of the bezel 2 and the front plate 3. FIG. 5 is an enlarged side view of a portion where the engaging hole is engaged with the engaging protrusion. FIG. 5 is an enlarged view of the engaging hole 211 and the engaging protrusion 312 engaged at a central portion of a long side of the display device A shown in FIG. 1.

As shown in FIGS. 1, 2, and the like, the engaging hole 211 and the engaging protrusion 312 are provided in a central portion of each of the parts of the bezel 2 and the front plate 3 corresponding to the four sides of the display device A. As shown in FIG. 5, the engaging hole 211 and the engaging protrusion 312 have a rectangular cross section extending in the direction along each side. While the engaging hole 211 and the engaging protrusion 312 have a rectangular cross section herein, this is not intended to be limiting in any way, and may instead have a circular, elliptical, or a non-rectangular polygonal cross section.

As shown in FIG. 5, the engaging hole 211 and the engaging protrusion 312 are formed in such sizes that the movements thereof are restricted in the long direction (here, in the x-direction). Once inserted into and engaged with the engaging hole 211, the engaging protrusion 312 is unlikely to shift along the long direction (x-direction) inside the engaging hole 211. In other words, the engagement of the engaging hole 211 with the engaging protrusion 312 provided in each of the long sides restricts the movement of the front plate 3 relative to the bezel 2 along the long side direction (x-direction). Similarly, the engagement of the engaging hole 211 with the engaging protrusion 312 provided in each of the short side portions restricts the movement of the front plate 3 relative to the bezel 2 along the short side direction (y-direction).

Thus, by engaging the engaging hole 211 with the engaging protrusion 312 provided in each of the long sides and the short sides, it is possible to mount the front plate 3 on the bezel 2 so as to restrict the movement of the front plate 3 relative to the bezel 2. The engagement of the engaging protrusion 312 with the engaging hole 211 also has the effect of preventing the front plate 3 from coming off from the bezel 2.

Further, engaging the engaging hole 211 with the engaging protrusion 312 in each of the long sides and the short sides fixes the positions along the long side direction and the short side direction, making it possible to position the front plate 3 relative to the bezel 2 and fix the front plate 3 to the bezel 2. As described above, the position of the bezel 2 relative to the display unit 1 is set when the bezel 2 is mounted on the chassis 15. As a result, the position of the front plate 3 relative to the display unit 1 is also set.

Figure 6:
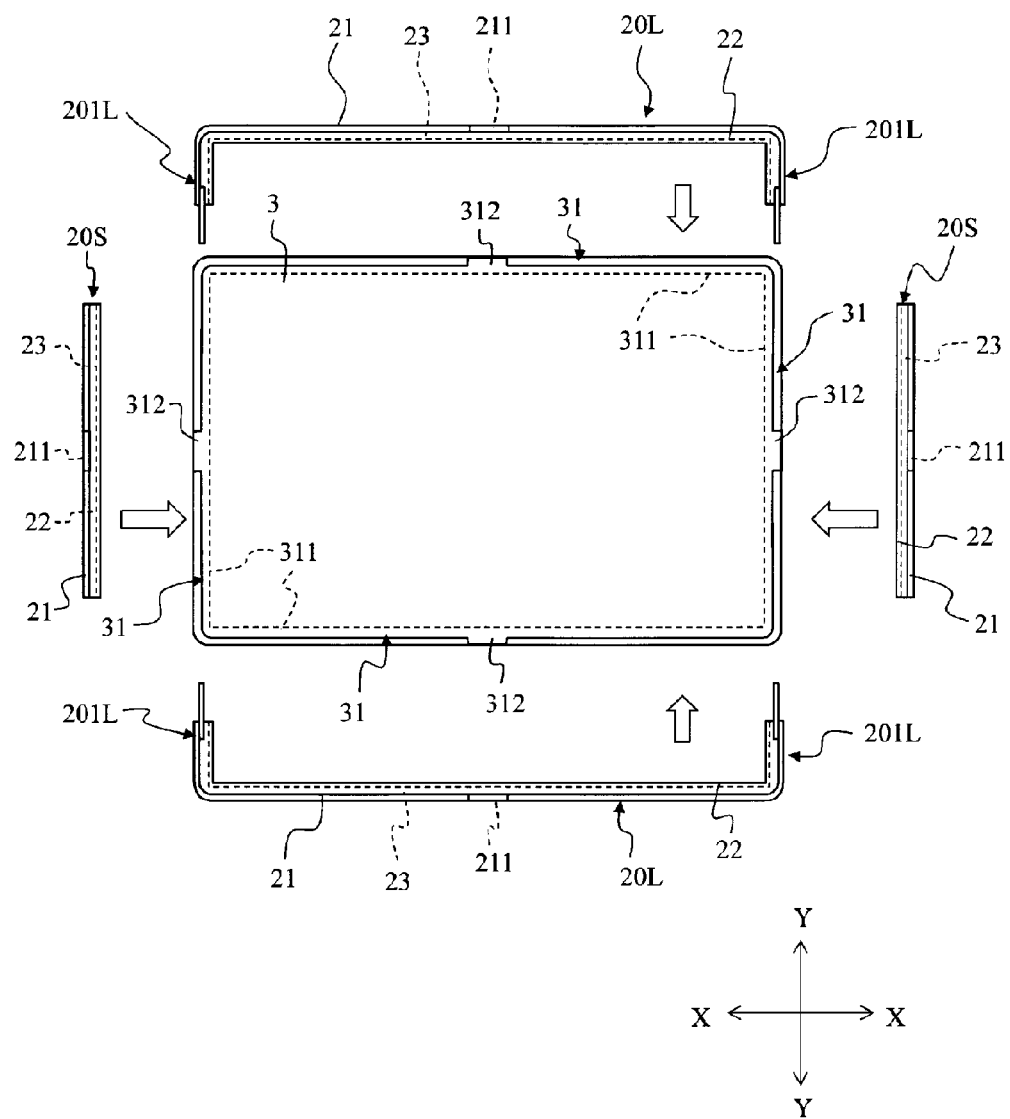
FIG. 6 is a diagram showing a bezel in a disassembled state.

Next, assembly of the bezel 2 with the front plate 3 will be described. FIG. 6 is a diagram showing the bezel in a disassembled state from the back surface side. As shown in FIG. 6, the bezel 2 is configured with long side members 20L and short side members 20S. The long side member 20L has a front view U shape provided with bent portions 201L at both ends, and includes both corners of a long side of the display device A. In other words, the ends of the long side member 20L are formed integrally with the ends of a short side. The short side members 20S are long-shaped members constituting the central portions of the short sides.

The bezel 2 has two sets of the long side member 20L and two sets of the short side member 20S. By fixing the bent portions 201L of the long side members 20L to the short side members 20S, the bezel 2 becomes a rectangular frame. While screw tightening is used here as the method of fixing the long side members 20L and the short side members 20S, this is not intended to be limiting in any way. The members may be fixed by fitting, pins, or the like.

Additionally, the aforementioned side wall 21, the pressing portion 22, and retaining portion 23 are formed in each of the long side members 20L and the short side members 20S. By joining the long side members 20L with the short side members 20S, the respective parts of the side wall 21, the pressing portion 22, and the retaining portion 23 formed on the long side members 20L and the short side members 20S are connected with one another. The engaging hole 211 is formed at a central portion of the long side direction of each of the long side members 20L and at a central portion of the long side direction of each of the short side members 20S.

When the bezel 2 is fixed to the front plate 3, the long side members 20L are mounted on the long sides of the front plate 3 first. At this time, by inserting each of the engaging protrusions 312 provided in the long sides of the front plate 3 into each of the engaging holes 211 of the long side members 20L, the long side members 20L are positioned relative to the long sides of the front plate 3. Here, the pressing portion 22 of the long side member 20L contacts the periphery of the back surface side of the front plate 3, while the retaining portion 23 thereof is inserted into the recessed groove 311. In addition, the cutout 31 of the front plate 3 is formed so that the inner wall thereof does not contact the inner side of the side wall of the bezel 2 while the distal end of the retaining portion 23 is designed so as to not reach the innermost portion of the recessed groove 311 (see FIGS. 3 and 4). This is done to absorb the difference in deformation due to linear expansion between the bezel 2 and the front plate 3. Details will be described later.

The short side members 20S are mounted on the front plate 3 such that each of the engaging protrusions 312 provided in the short sides of the front plate 3 is inserted into each of the engaging holes 211. This sets the positions of the short side members 20S relative to the short sides of the front plate 3, and the ends of the short side members 20S overlap the distal ends of the bent portions 201L of the long side members 20L. Connecting these overlapped portions with screws Sc fixes the long side members 20L to the short side members 20S, completing the assembly of the bezel 2 with the front plate 3.

Next, the deformation of the display device A due to temperature change will be described. In the display device A, the bezel 2 is assumed to be formed by a metal (aluminum in this case), and the front plate 3 by a resin (acryl in this case). The display device A is equipped with members that generate heat when the LEDs 131 and the like, which serve as the light source, are operating (emitting light), and temperature rises as heat is generated by these members. In general, the coefficient of linear expansion of aluminum is approximately $2.36 \times 10^{-5}$ (1/K), while the coefficient of linear expansion of acryl is approximately $7.0 \times 10^{-5}$ (1/K).

As temperature rises, the bezel 2 and the front plate 3 expand in the long side direction (x-direction) and the short side direction (y-direction). As mentioned above, the bezel 2 is formed by a metal, which has a low coefficient of linear expansion, and the front plate 3 is formed by a resin, which has a high coefficient of linear expansion. For this reason, when the temperature of the display device A rises, the deformation of the front plate 3 is larger than the deformation of the bezel 2.

At this time, the deformation (displacement) of the bezel 2 and the front plate 3 due to thermal expansion is greater at the edges. The difference between the bezel 2 and the front plate 3 in deformation due to thermal expansion (difference in thermal expansion) is also greater at the edges. More particularly, the deformation of the front plate 3 due to thermal expansion in the long side direction is the greatest at the ends of the long side direction, while the deformation due to thermal expansion in the short side direction is the greatest at the ends of the short side direction. Since the long side direction and the short side direction are orthogonal to each other, the deformation in the long sides of the front plate 3 is the greatest in the direction intersecting with (orthogonal to) the long sides (in other words, the short side direction); the deformation in the short sides is the greatest in the direction intersecting with (orthogonal to) the short sides (in other words, the long side direction).

As shown in FIGS. 3 and 4, on each side of the display device A, the inner surface of the side wall 21 of the bezel 2 does not contact the side wall of the cutout 31 of the front plate 3. In other words, a gap is created by a clearance CL1 formed between the side wall 21 and the side wall of the cutout 31. Additionally, a gap is also created by a clearance CL2 formed between the distal end of the retaining portion 23 and the innermost portion of the recessed groove 311. Since the gaps are formed in the direction intersecting with (orthogonal to) each side, the gap formed by the clearance CL1 makes it unlikely that the side wall 21 of the bezel 2 will come into contact with the side wall of the cutout 31 of the front plate 3, even if a difference in thermal expansion occurs between the bezel 2 and the front plate 3.

This has the effect of suppressing thermal stress that occurs when the side wall 21 of the bezel 2 contacts the cutout 31 of the front plate 3 due to a difference in thermal expansion. Similarly, since a gap is formed by the clearance CL2, thermal stress occurring as a result of a contact between the retaining portion 23 of the bezel 2 and the innermost portion of the recessed groove 311 is also suppressed.

The engaging hole 211 and the engaging protrusion 312 are provided in a central portion of each of the four sides of the display device A. Additionally, the movements of the engaging hole 211 and the engaging protrusion 312 are restricted in the direction along the corresponding side. As mentioned above, the difference in thermal expansion between the bezel 2 and the front plate 3 is small in the central portion. In addition, since the lengths of the engaging hole 211 and the engaging protrusion 312 along the long side direction are short, the difference in thermal expansion between the engaging hole 211 and the engaging protrusion 312 along the long side direction, or the direction along the side on which engaging hole 211 and the engaging protrusion 312 are provided, is small. For this reason, thermal stress is unlikely to apply to the engaging hole 211 and the engaging protrusion 312 along the direction of the corresponding side.

Further, the engaging protrusion 312 is engaged with the engaging hole 211 when inserted into the engaging hole 211, as shown in FIG. 3. Since the engaging hole 211 and the engaging protrusion 312 are not fixed by adhesives, screws, or the like, the engaging protrusion 312 is slidable against the engaging hole 211 in the direction of insertion (the y-direction in FIG. 3). Moreover, the direction in which the engaging protrusion 312 is inserted into the engaging hole 211 is a direction intersecting with (orthogonal to) the corresponding side. For this reason, even if the difference in thermal expansion increases between the bezel 2 and the front plate 3, the engaging protrusion 312 and the engaging hole 211 slide against each other, and thermal stress is therefore unlikely to occur.

For example, in a long side of the display device A, the engaging hole 211 and the engaging protrusion 312 are formed at a central portion of the side. Therefore, the difference in thermal expansion along the long side direction (x-direction) is small. At the same time, since the aforementioned engaging hole 211 and the aforementioned engaging protrusion 312 are formed at an edge of the short side direction (y-direction), the difference in thermal expansion along the short side direction (y-direction) is large. As mentioned above, since the direction of sliding of the engaging protrusion 312 inside the engaging hole 211 is a direction orthogonal to the long side (here, the y-direction), thermal stress caused by the thermal expansion along the short side direction is suppressed.

Note that it is preferable that the sizes of the engaging hole 211 and the engaging protrusion 312 along the long side direction be such that the stress caused by the difference in thermal expansion is negligible. Further, it is preferable that a gap be formed in a size that is sufficient to suppress thermal stress in the event a difference in thermal expansion occurs between the engaging hole 211 and the engaging protrusion 312 along the long side direction, while preventing the misalignment that occurs when the positions are set.

In the display device A according to the present invention, the difference in deformation caused by the thermal expansion of the bezel 2 and the front plate 3 are tolerated (absorbed) by the gap created by the clearance CL1 between the side wall 21 of the bezel 2 and the side wall of the cutout 31 of the front plate 3, as well as the gap created by the clearance CL2 between the distal end of the retaining portion 23 and the innermost portion of the recessed groove 311, thereby suppressing thermal stress. In addition, the engaging hole 211 and the engaging protrusion 312 are formed at a central portion of the long side direction of each side in short lengths. For this reason, the difference in deformation is small and a large thermal stress is less likely to occur in the long side direction. Further, since sliding is enabled in the direction in which the engaging protrusion 312 is inserted into the engaging hole 211, the difference in deformation due to thermal expansion is tolerated (absorbed), and thermal stress is suppressed.

As described above, the display device A according to the present invention suppresses the thermal stress caused by the difference in thermal expansion between the bezel 2 and the front plate 3. Since the thermal stress is suppressed, deformations such as warping and bending, as well as damages of the front plate 3 are suppressed in the display device A according to the present invention. Additionally, in the display device A according to the present invention, the bezel 2 and the front plate 3 are assembled together by supporting the periphery of the back surface of the front plate 3 with the pressing portion 22, inserting the retaining portion 23 into the recessed groove 311, and engaging the engaging holes 211 with the engaging protrusions 312. For this reason, the engagement areas of the bezel 2 and the front plate 3 can be smaller than in a conventional bonding type, thereby allowing the frame to be narrower. Further, it is also possible to simplify the steps of manufacturing the display device since the step of adhering the bezel 2 to the front plate 3 (attaching using a double-sided tape) can be eliminated.

Note that the engaging holes 211 and the engaging protrusions 312 may be formed in one of the top and the bottom sides and both of the left and the right sides of the display device A. The engaging holes 211 and the engaging protrusions 312 can be employed in a broad range of areas and number of units that can accurately position the front plate 3 relative to the bezel 2 and prevent thermal stress from occurring due to a difference in thermal expansion.

Note that the clearance CL1 and the clearance CL2 may be identical or substantially identical, or may be of different values. The clearance CL1 and the clearance CL2 are determined by the coefficients of linear expansion of the bezel 2 and the front plate 3, the lengths of the four sides of the display device, and the temperature difference generated by operating the display device. The clearance CL1 and the clearance CL2 are set so that the bezel 2 does not come into contact with the front plate 3 due to a difference in thermal expansion.

When the display device A is placed in a low-temperature environment, the bezel 2 is less likely to contract while the front plate 3 is more likely to contract. When the bezel 2 and the front plate 3 contract due to low temperature, there is a possibility that the recessed groove 311 and the retaining portion 23 come off from each other. To prevent such problems, it is preferable that the extent to which the retaining portion 23 is inserted into the recessed groove 311 be such that the retaining portion 23 is prevented from coming out of the recessed groove 311 even at a low temperature that falls within the range in which the use of the display device A is expected.

Embodiment 2

Figure 7:
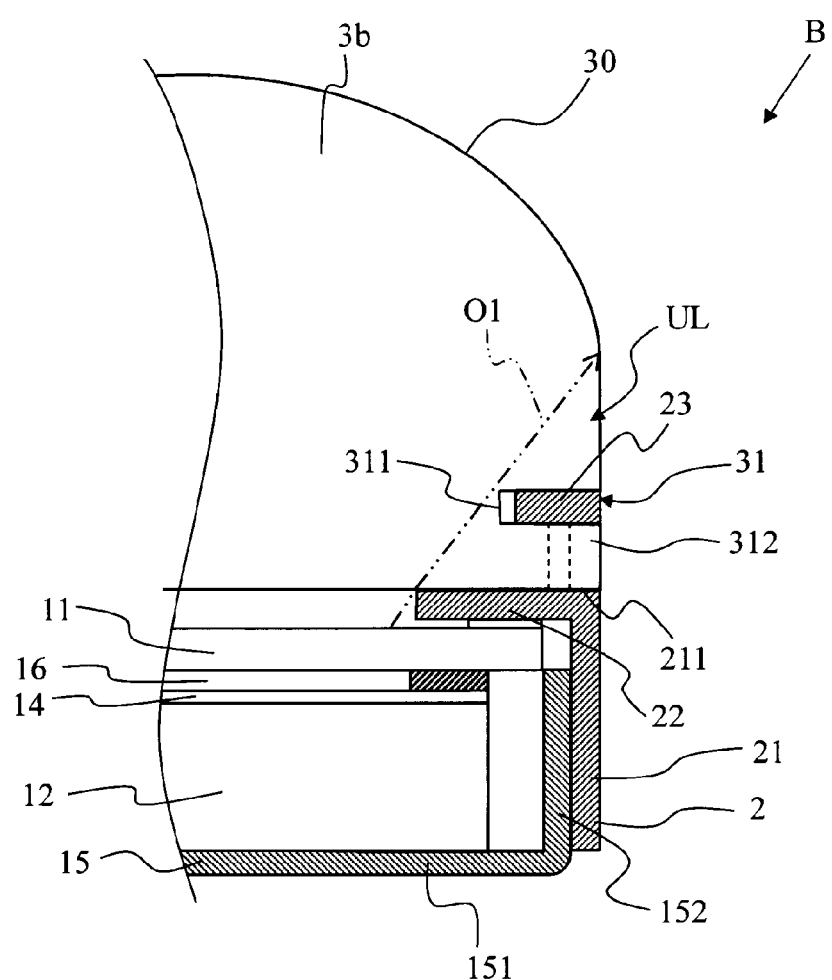
FIG. 7 is a cross-sectional view of another example of a display device according to the present invention.

Another example of a display device according to the present invention is described in reference to diagrams. FIG. 7 is a cross-sectional view of another example of a display device according to the present invention. Other than having a different front plate 3b, a display device B shown in FIG. 7 has the same configuration as that of the display device A, and substantially identical portions are given identical reference characters.

As shown in FIG. 7, the display device B has a curved surface 30 in the periphery of the front surface of the front plate 3b. The curved surface 30 is formed so as to act as a lens. In the front plate 3b, a cutout 31 is formed so as to fit into the back surface side of the curved surface 30 when seen from the front view.

In the display device B, a display unit 1 displays images by modulating the colors of light emitted by a backlight 10 for each pixel using a liquid crystal display panel 11. The light then passes through an opening of a bezel 2 and the front plate 3b. The light passing near the opening of the bezel 2 is emitted so as to extend in an outward direction.

The front plate 3b is a plate-like member formed by a transparent resin, and has a refractive index different from the refractive index of air. For this reason, light entering the front plate 3b perpendicular to the back surface passes through the front plate 3b while keeping the optical path perpendicular to the back surface, and then exits from the front surface of the front plate 3b. In contrast, when light extending outward enters the front plate 3b, the light passes through the front plate 3b in an optical path that extends outward. In the outer edge of the front plate 3b, light extending outward exits the front plate 3b to the outside (front surface side) via the curved surface 30.

The curved surface 30 is shaped so as to cause light incident to the curved surface 30 to refract toward the front surface side. As shown in FIG. 7, the distal end side of the pressing portion 22 of the bezel 2 forms the periphery of the opening. For this reason, light passing through the area near the pressing portion 22 of the bezel 2 becomes the outermost light (indicated as an optical path O1). By forming the curved surface 30 so that light traveling through the optical path O1 illuminates the outermost portion of the curved surface 30 of the front plate 3b, light passing through the optical path O1 can be seen in the outermost portion of the display device B when viewed from the front surface side.

When the front plate 3b is seen from the front surface side, light passing through the optical path O1 becomes the outermost light. Therefore, any portion that is on the back surface side of the optical path O1 becomes a visually hidden region, or an invisible region UL. By forming the cutout 31 in the invisible region UL of the front plate 3b, it is possible to make the cutout 31 visually concealed (make the cutout 31 invisible) when the display device B is viewed from the front surface side. Additionally, by forming the bezel 2 on the back surface side of the invisible region UL, the bezel 2, including the pressing portion 22, also becomes invisible when the display device B is viewed from the front surface side.

According to the above configuration, the display device B can visually conceal supporting members and the like (a cover member such as a bezel, for example) disposed in the periphery when seen from the front view, thereby making the frame region invisible. All other components are identical to those of Embodiment 1.

Working Examples

Figure 8:
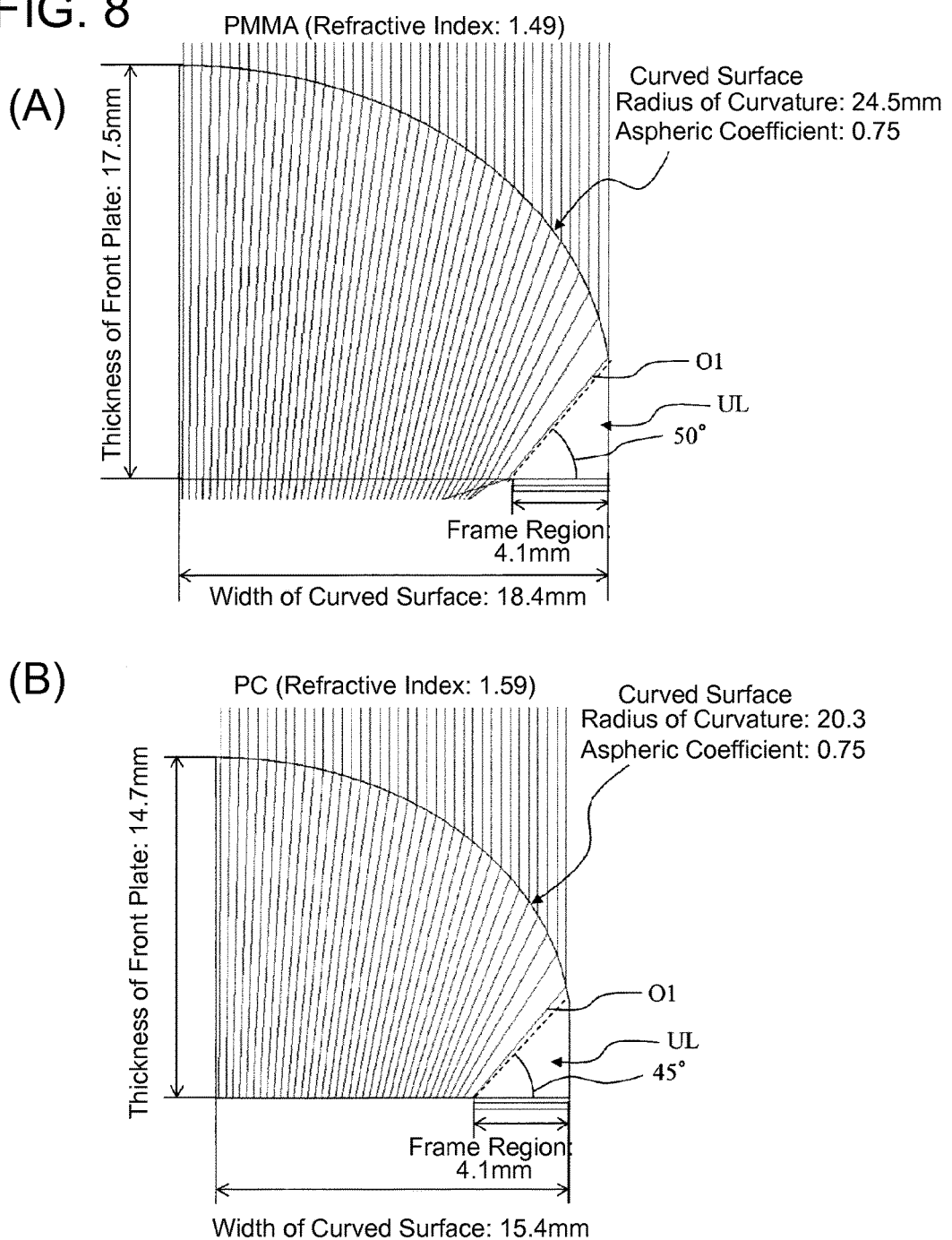
FIG. 8A is a diagram showing an optical path of light passing through a curved surface of an example of a front plate.
FIG. 8B is a diagram showing an optical path of light passing through a curved surface of another example of a front plate.

Configuration examples of a front plate such as the one shown in the present embodiment will be described with reference to diagrams. FIG. 8A is a diagram showing an optical path of light passing through a curved surface of an example of a front plate used for a display device according to the present invention. FIG. 8B is a diagram showing an optical path of light passing through a curved surface of another example of a front plate used for a display device according to the present invention. For convenience, the example shown in FIG. 8A will be referred to as Working Example 1, and the example shown in FIG. 8B will be referred to as Working Example 2.

In Working Example 1, the front plate 3b is formed by an acrylic resin (PMMA). In Working Example 2, the front plate 3b is formed by polycarbonate (PC). In both working examples, the width of the pressing portion 22 of the bezel 2 is 4.1 mm, while the aspheric coefficient of the curved surface 30 is 0.75.

The acrylic resin used in Working Example 1 has a refractive index of 1.49. As shown in FIG. 8A, the optical path O1, the outermost light passing through the edge of the pressing portion 22 of the bezel 2, exits at an angle of 50° to the back surface of the front plate 3b. The curved surface plate 30 is formed so that light traveling through the optical path O1 illuminates the outermost side and is refracted toward the front direction.

At this time, the radius of curvature of the curved surface 30 is 24.5 mm, while the width of the curved surface 30 is 18.4 mm in a front view and the thickness of the front plate 3b is 17.5 mm. By forming a cutout 31 in the invisible region UL, an area in the back surface side of the front plate 3b that is on an outer side than the optical path O1 (the triangular portion in the lower right corner of the diagram), it is possible to make the frame region, including the bezel 2, invisible.

Polycarbonate, which is used in Working Example 2, has a refractive index of 1.59. As shown in FIG. 8B, the optical path O1, the outermost light passing through the edge of the pressing portion 22 of the bezel 2, exits at an angle of 45° to the back surface of the front plate 3b. The curved surface 30 is formed so that light traveling through the optical path O1 illuminates the outermost side and is refracted toward the front direction.

At this time, the radius of curvature of the curved surface 30 is 20.3 mm, while the width of the curved surface 30 is 15.4 mm in a front view and the thickness of the front plate 3b is 14.7 mm. By forming a cutout 31 in the invisible region UL, an area in the back surface side of the front plate 3b that is on an outer side than the optical path O1 (the triangular portion in the lower right corner of the diagram), it is possible to make the frame region, including the bezel 2, invisible.

Thus, the width of the curved surface 30 in a front view and the width of the front plate 3b are determined by the material forming the front plate 3b, the width of the pressing portion 22 of the bezel 2, and the aspheric coefficient of the curved surface 30.

Embodiment 3

Figure 9:
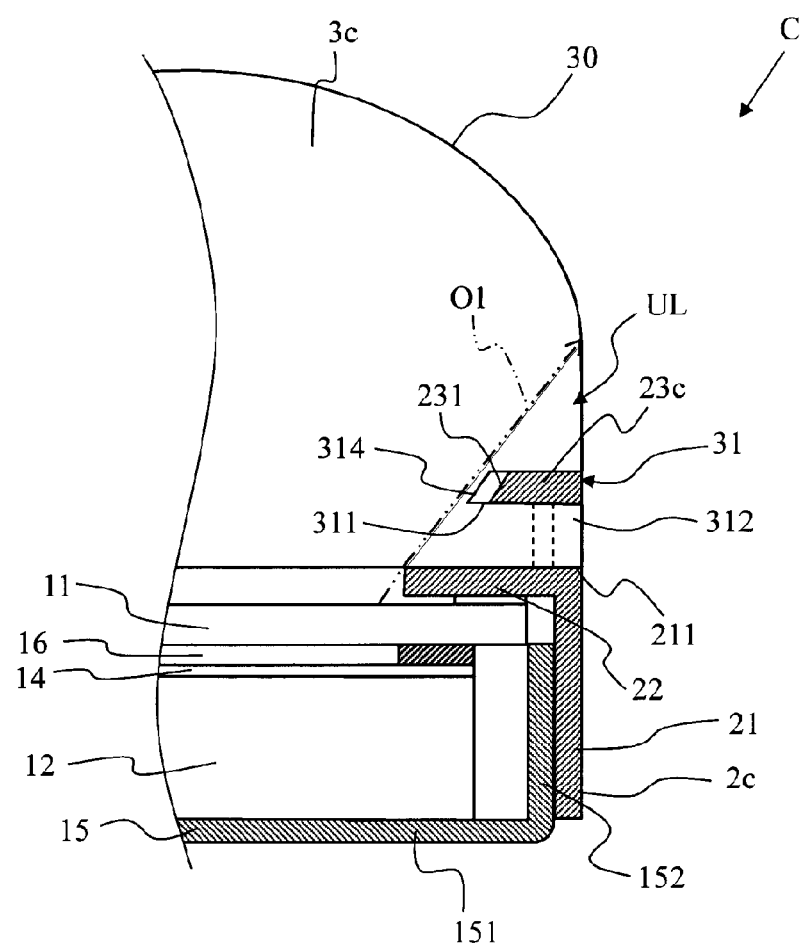
FIG. 9 is a cross-sectional view of another example of a display device according to the present invention.

Another example of the display device according to the present invention will be described with reference to diagrams. FIG. 9 is a cross-sectional view of another example of a display device according to the present invention. Other than having a different retaining portion 23c of a bezel 2c and a different recessed groove 313 of a front plate 3c, a display device C shown in FIG. 9 has the same configuration as that of the display device B. Identical reference characters are given to substantially identical portions, and detailed descriptions of the same portions will be omitted.

In the display device C, the recessed groove 313 of the front plate 3c has, at the innermost portion, an inclined surface 314 provided with an inclination so as not to block an optical path O1, the outermost optical path, as shown in FIG. 9. In other words, the inclined surface 314 is inclined in the same direction as the optical path O1. In addition, the retaining portion 23c of the bezel 2c is provided with an inclined portion 231 with an inclination in the same direction as that of the inclined surface 314, so as not to come into contact with the inclined surface 314 even if a difference in thermal expansion occurs between the bezel 2c and the front plate 3c.

By forming the retaining portion 23c and the recessed groove 313 in this manner, it is possible to extend the length of the retaining portion 23c on the back surface side. This makes it possible to ensure that the surface of the retaining portion 23c on the back surface side and the recessed groove 313 are engaged, while preventing the recessed groove 313 and (or) the retaining portion 23c from blocking light passing through the optical path O1. In this manner, it is possible to ensure that the frame region is invisible when the display device C is viewed from the front surface side and to securely fix the bezel 2c to the front plate 3c. Note that all other portions are identical to those of Embodiments 1 and 2.

Embodiment 4

Figure 10:
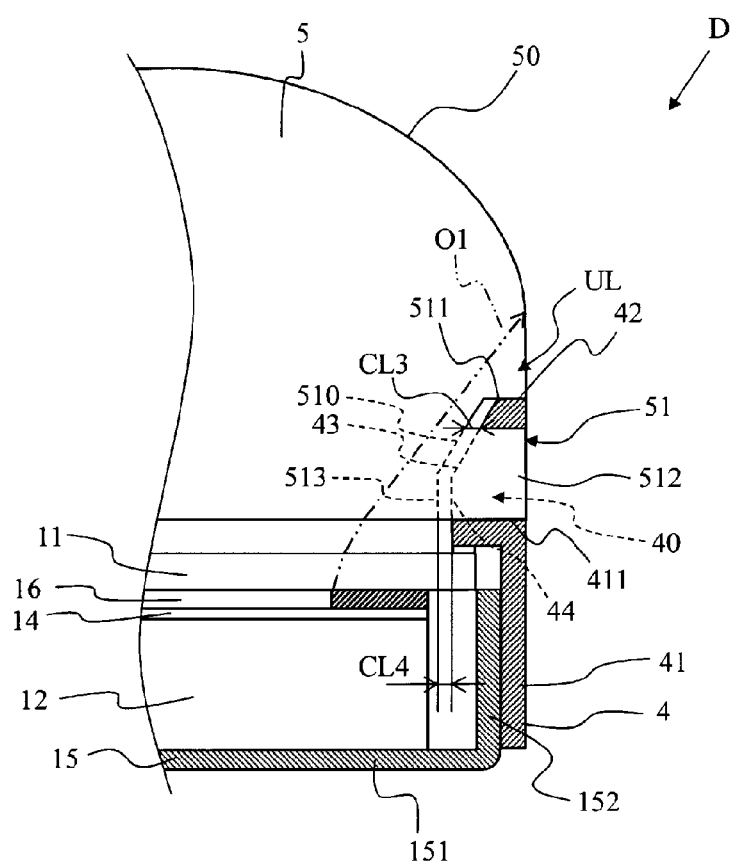
FIG. 10 is a cross-sectional view of another example of a display device according to the present invention, including a portion where an engaging hole and an engaging protrusion are engaged to each other.
Figure 11:
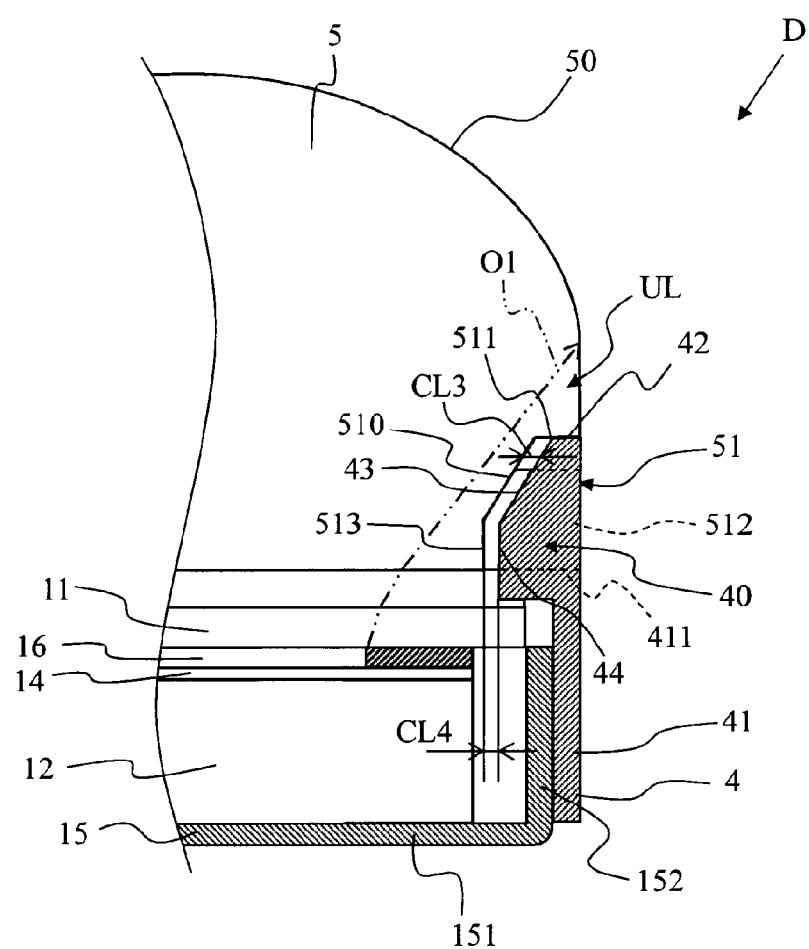
FIG. 11 is a cross-sectional view of another example of a display device according to the present invention, including a portion where an engaging hole and an engaging protrusion are disengaged from each other.

Another example of a display device according to the present invention will be described with reference to diagrams. FIG. 10 is a cross-sectional view of another example of a display device according to the present invention, including a portion where an engaging hole and an engaging protrusion are engaged to each other. FIG. 11 is a cross-sectional view of another example of a display device according to the present invention, including a portion where an engaging hole and an engaging protrusion are disengaged from each other. Other than a bezel 4 and a front plate 5, those portions of a display device D shown in FIGS. 10 and 11 that are substantially identical to those of the display device B are given the same reference characters, and duplicate descriptions of the identical portions will be omitted. Additionally, FIG. 10 shows a cross-sectional view taken along the same line as that used in FIG. 3, and FIG. 11 shows a cross-sectional view taken along the same line as that used in FIG. 4.

As shown in FIGS. 10 and 11, the display device D is equipped with the bezel 4 and the front plate 5 fixed to the bezel 4. The front plate 5 has a cutout 51 on the back surface side of the periphery. The cutout 51 is formed in an invisible region UL of the front plate 5. At the end of the front surface side of the cutout 51, a pressed portion 511 is formed parallel to the back surface, and an inclined portion 510, connected to an end of the inner side of the pressed portion 511 and inclined so as not to overlap an optical path O1, is formed. Further, provided on the back surface side of the inclined portion 510 is a side face 513, which extends upward perpendicularly from an end of the back surface of the front plate 5 so as to connect with the inclined portion 510.

In addition, the bezel 4 has a supporting portion 40, which is shaped so as to be insertable into the cutout 51 of the front plate 5. The back surface side of the supporting portion 40 of the bezel 4 is formed so as to extend straight. A contact between the back surface side of the supporting portion 40 and an edge of the front surface side of chassis 15 ensures that the bezel 4 and the chassis 15 are positioned relative to each other.

The supporting portion 40 of the bezel 4 is equipped with: a pressing portion 42, which is provided at the end of the front surface side of a side wall 41 and contacts the pressed portion 511; a tapering portion 43 connected to the pressing portion 42 and facing the inclined portion 510 of the front plate 5; and an inner surface 44 facing the side face 513. Since the pressing portion 42 of the bezel 4 presses the pressed portion 511 of the front plate 5, the back surface of the front plate 5 is prevented from coming into contact with a liquid crystal display panel 11.

In the display device D, a gap is formed by a clearance CL3 between the tapering portion 43 and the inclined portion 510, and a gap is formed by a clearance CL4 between the inner surface 44 and the side face 513. The clearance CL3 and the clearance CL4 formed between the bezel 4 and the front plate 5 in this manner can prevent the bezel 4 and the front plate 5 from coming into contact with each other even if a difference in thermal expansion arises between the bezel 4 and the front plate 5, and suppresses thermal stress.

As shown in FIG. 10, provided at a central portion of each of the four sides of the display device D are: an engaging hole 411, a through hole formed on the side wall 41 of the bezel 4; and an engaging protrusion 512, which protrudes from the side face 513 of the cutout 51 of the front plate 5. Inserting the engaging protrusion 512 into the engaging hole 411 engages the engaging protrusion 512 with the engaging hole 411. Note that thermal stress at the engagement portion of the engaging hole 411 and the engaging protrusion 512 is suppressed due to the same reasons as those for the engagement portion of the engaging hole 211 and the engaging protrusion 312. In addition, in the display device D, the engagement of the engaging hole 411 with the engaging protrusion 512 prevents the front plate 5 from falling toward the front surface side.

In this manner, it is possible to increase the strength of the bezel 4 by forming the supporting portion 40 on the front surface side of the bezel 4. For this reason, a resin, in addition to metals, can be employed as a material for the bezel 4. This makes it possible to broaden the range of options available for materials constituting the display device D. Further, since the width of a portion protruding inward from the side wall 41 of the bezel 4 can be reduced, it is possible to visually conceal the frame region even if the invisible region UL is smaller. This then makes it possible to reduce the thickness of the front plate 5. Note that effects other than those described above are the same as those of Embodiments 1 to 3.

Embodiment 5

Figure 12:
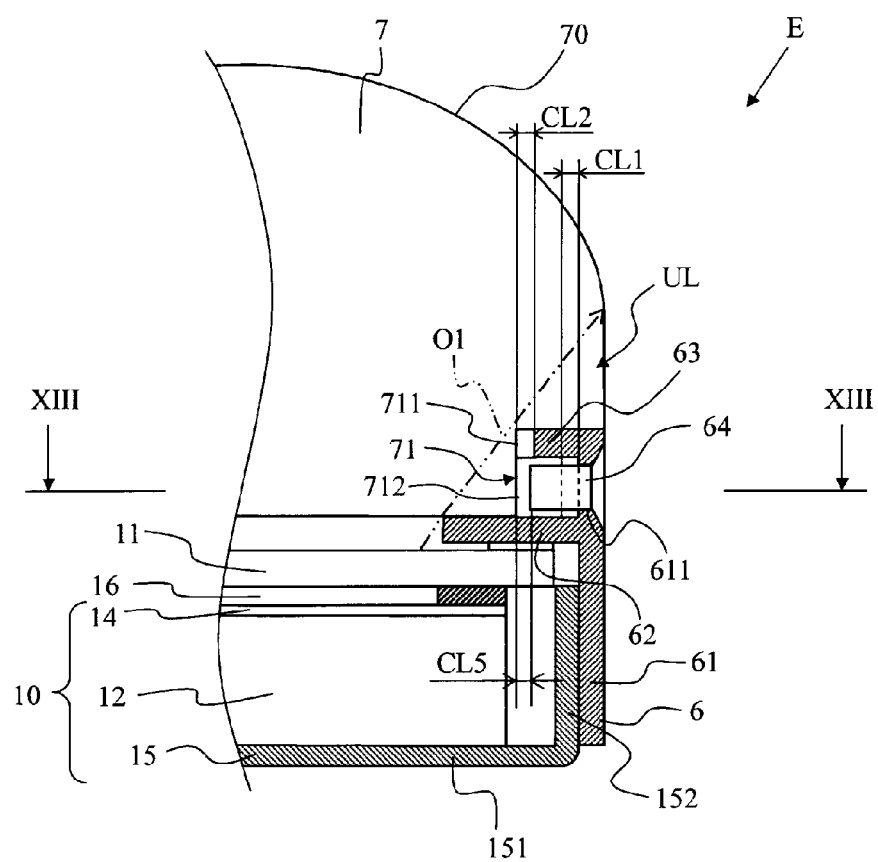
FIG. 12 is a cross-sectional view of another example of a display device according to the present invention, including an engaging protrusion.
Figure 13:
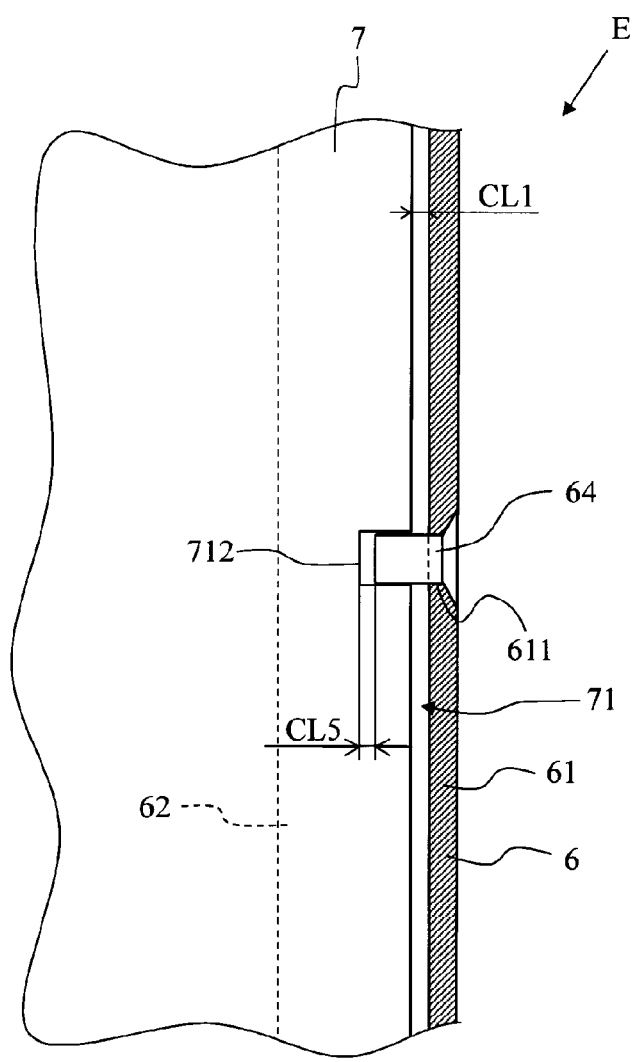
FIG. 13 is a cross-sectional view of the display device taken along the line XIII-XIII shown in FIG. 12.

Another example of a display device according to the present invention will be described with reference to diagrams. FIG. 12 is a cross-sectional view of another example of a display device according to the present invention, including an engaging protrusion. FIG. 13 is a cross-sectional view of the display device taken along the line XIII-XIII shown in FIG. 12. A display device E shown in FIGS. 12 and 13 is equipped with a bezel 6 and a front plate 7.

In the display device E, the bezel 6 is equipped with: a side wall 61; a pressing portion 62, and a retaining portion 63. The side wall 61, the pressing portion 62, and the retaining portion 63 respectively have the same configurations as those of the side wall 21, the pressing portion 22, and the retaining portion 23 of the bezel 2 of the display device B, and detailed descriptions thereof will be omitted.

Additionally, a front plate 7 is equipped with a curved surface 70, a cutout 71, and a recessed groove 711 formed in the cutout 71, which respectively have the same configurations as the curved surface 30, the cutout 31, and the recessed groove 311 of the front plate 3b of the display device B. For this reason, detailed descriptions will be omitted.

In addition, as shown in FIG. 13, a screw hole 611, where a screw 64 is inserted, is formed at a portion of the side wall 61 of the bezel 6 that constitutes a central portion of a side of the display device E. The screw hole 611 and the screw 64 inserted into the screw hole 611 constitute a first engaging portion 1 in lieu of the engaging hole 211 provided in the display device B. The screw hole 611 is formed at a portion between the pressing portion 62 and the retaining portion 63 of the side wall 61, as shown in FIG. 12.

As shown in FIGS. 12 and 13, the side face of the cutout 71 of the front plate 7 is provided with an engaging recessed hole 712 (recessed cutout) having the shape of a recessed hole, where the distal end of the screw 64 is inserted. The engaging recessed hole 712 constitutes a second engaging portion in lieu of the engaging protrusion 312 provided in the front plate 3b of the display device B. Note that the screw hole 611 and the engaging recessed hole 712 respectively form the first engaging portion and the second engaging portion, and are formed at a central portion of each side of the display device E, in a manner similar to the display devices A to D.

Once the bezel 6 and the front plate 7 are assembled together, the screw 64 is inserted into the screw hole 611 of the bezel 6, and a portion of the screw 64 protruding out of the screw hole 611 is inserted into the engaging hole 712. At this time, a gap created by a clearance CL5 formed between the innermost portion of the engaging hole 712 and the distal end of the screw 64 suppresses an occurrence of thermal stress caused by a difference in thermal expansion. Additionally, since the outer surface of the screw 64 and the inner surface of the engaging hole 712 are formed with a small or negligible gap therebetween, the positions can be set.

In other words, the display device E is configured such that the protruding portion that protrudes out of the bezel 6 (the protruding portion of the screw 64) engages with the recessed portion of the front plate 7 (the engaging recessed hole 712). According to this configuration, too, it is possible to prevent the front plate from deforming and minimize the steps of manufacturing the display device while making the frame region narrower.

In the present embodiment, by using the screw hole 611 and the screw 64, the protrusion of the screw 64 out of the screw hole 611 can be adjusted. This makes it possible to prevent thermal stress due to a difference in thermal expansion from occurring and make adjustments to ensure that the positions can be set.

Additionally, while the screw hole 611 and the screw 64 are employed as the first engaging portion, the configurations thereof are not limited to those described above. For example, an engaging protrusion such as the engaging protrusion 312 of the front plate 3 that protrudes out of the bezel 6 can be formed to engage with the engaging recessed hole 712 formed in the front plate 7. When the bezel 6 is formed by bending a metal plate, it will be difficult to form an engaging protrusion as a part of the bezel 6. Therefore, an engaging protrusion can be formed separately and connected. Further, when the bezel 6 is formed by a resin, an engaging protrusion can be formed as a part thereof.

Other characteristics are the same as those of Embodiments 1 and 2.

In each of the embodiments described above, while an edge-lit backlight using a light guide plate is employed, this does not limit the scope of the present invention. A direct-lit backlight can also be employed by disposing a light source on a surface opposite to the back surface of the liquid crystal display panel.

Additionally, in each of the embodiments described above, a liquid crystal display device employing a liquid crystal display panel and a backlight as a display unit is used. However, this does not limit the scope of the present invention. A broad range of display devices applicable to thin-type display devices can be used, including plasma display devices, EL display devices, and the like. Further, by using a light-emitting unit in lieu of a display unit, the present invention can also be used as a so-called illuminating device, which radiates light to the outside. Note that, in this case, a liquid crystal panel can be disposed as a light-modulating device on the front surface side of the light-emitting unit.

Thus, the embodiments of the present invention were described above in detail, but the present invention is not limited by the description above. Various modifications of the embodiments of the present invention are possible within the spirit of the present invention.

INDUSTRIAL APPLICABILITY

The present invention is applicable to display devices that display images, such as liquid crystal televisions and liquid crystal display devices.

| Description of Reference Characters | |
| --- | --- |
| A to E | display device |
| 1 | display unit |
| 10 | backlight |
| 11 | liquid crystal display panel |
| 12 | light guide plate |
| 121 | light-receiving face |
| 122 | light-exiting surface |
| 13 | light source unit |
| 131 | LED |
| 132 | substrate |
| 14 | optical sheet |
| 15 | chassis |
| 16 | panel frame |
| 2, 2c | bezel |
| 21 | side wall |
| 211 | engaging hole |
| 22 | pressing portion |
| 23, 23c | retaining portion |
| 231 | inclined portion |
| 20L | long side member |
| 20S | short side member |
| 3, 3a, 3b, 3c | front plate |
| 30 | curved surface |
| 31 | cutout |
| 311 | recessed groove |
| 312 | engaging protrusion |
| 313 | recessed groove |
| 314 | inclined surface |

-continued

| Description of Reference Characters | |
|---|---|
| 4 | bezel |
| 40 | supporting portion |
| 41 | side wall |
| 42 | pressing portion |
| 43 | tapering portion |
| 5 | front plate |
| 51 | cutout |
| 510 | inclined portion |
| 511 | pressed portion |
| 512 | engaging protrusion |
| 513 | side face |
| 6 | bezel |
| 61 | side wall |
| 611 | screw hole |
| 62 | pressing portion |
| 63 | retaining portion |
| 64 | screw |
| 7 | front plate |
| 70 | curved surface |
| 71 | cutout |
| 711 | recessed groove |
| 712 | engaging recessed hole |

What is claimed is:

1. A display device, comprising:
a frame member having a side wall enclosing a display unit having a rectangular shape;
a front plate disposed on a front surface of said display unit and said frame member, the front plate and the frame member having two long sides and two short side corresponding to each other,
the front plate having a stepped peripheral edge being a cutout integrally formed as a singular monolithic element of the front plate of a back surface thereof to receive a top of said sidewall of the frame member, the stepped peripheral edge being disposed at every long and short side of the back surface of the front plate;
a first engaging portion integrally formed in said frame member; and
a second engaging portion integrally formed in said front plate that engages the first engaging portion,
wherein a gap is provided between an inner surface of said side wall of the frame member and a side wall of said stepped peripheral edge of the back surface of the front plate, wherein said first engaging portion engages said second engaging portion such that movement of said first engaging portion and said second engaging portion is restricted in a direction along said side wall of the frame member and so as to be slidable in a direction perpendicular to said side wall, and
wherein respective sizes of first engaging portion and the second engaging portion along said direction along said side wall and a size of said gap are provided according to a difference in thermal expansion between the frame member and the front plate such that stress caused by the difference in thermal expansion between the frame member and the front plate is suppressed and that misalignment between the frame member and the front plate is prevented.

2. The display device according to claim 1,
wherein said frame member and said front plate have a rectangular shape in a front view, and
wherein said first engaging portion and said second engaging portion are respectively formed in two short sides and at least one long side of said frame member and said front plate.

3. The display device according to claim 2, wherein said first engaging portion and said second engaging portion are formed at a central portion of the respective sides of said frame member and said front plate.

4. The display device according to claim 1,
wherein said first engaging portion is a through hole formed in said side wall of the frame member, and
wherein said second engaging portion is a protrusion integrally formed in said side wall of said stepped peripheral edge of the back surface of said front plate so as to protrude therefrom.

5. The display device according to claim 1,
wherein said first engaging portion is an engaging member protruding toward an inner side of said frame member, and
wherein said second engaging portion is a recessed cutout formed in a side face of said stepped peripheral edge of the back surface of said front plate, said recessed cutout being formed such that a protrusion of said engaging member is inserted therein.

6. The display device according to claim 1,
wherein said frame member further includes a retaining portion protruding laterally in a direction parallel to said front surface of said display unit and inwardly from a front end of said frame member,
wherein said stepped peripheral edge of the back surface of said front plate further includes a groove receding laterally in the direction parallel to said front surface of said display unit to receive said retaining portion of the frame member, and
wherein a gap is provided between a bottom of said groove and a tip of said retaining portion.

7. The display device according to claim 6, wherein a front surface side of said front plate opposing said stepped peripheral edge of the back surface is provided with a curved surface such that a portion of said front plate that has the curved surface acts as a lens causing light passing through a periphery of said front plate to refract toward the front surface side.

8. The display device according to claim 7, wherein the bottom of said groove is inclined so as not to block light emitted from said display unit and passing through said curved surface.

9. The display device according to claim 7,
wherein said stepped peripheral edge of the back surface has an inclined face such that light emitted from said display unit and entering said curved surface of said front plate is not blocked by said inclined face,
wherein a front end of said frame member is provided with a tapering portion formed along the inclined face of said stepped peripheral edge of the back surface, and
wherein a gap is provided between the tapering portion of the front end of said frame member and the inclined face of said stepped peripheral edge of the back surface such that the tapering portion and the inclined face do not come into contact with each other.

10. The display device according to claim 1, wherein said display unit is a unit that emits planar light from the front surface of said display unit.

11. The display device according to claim 1, wherein a front surface side of said front plate opposing said stepped peripheral edge of the back surface is provided with a curved surface such that a portion of said front plate that has the curved surface acts as a lens causing light passing through a periphery of said front plate to refract toward the front surface side.

12. The display device according to claim 6, wherein the bottom of said groove is inclined so as not to block light emitted from said display unit and passing through said curved surface.

13. The display device according to claim 6,
- wherein said stepped peripheral edge of the back surface has an inclined face such that light emitted from said display unit and entering a front surface of said front plate is not blocked by said inclined face,
- wherein a front end of said frame member is provided with a tapering portion formed along the inclined face of said stepped peripheral edge of the back surface, and
- wherein a gap is provided between the tapering portion of the front end of said frame member and the inclined face of said stepped peripheral edge of the back surface so that the tapering portion and the inclined face do not come into contact with each other under thermal stress.

\* \* \* \* \*